(12) United States Patent
Srivastava et al.

(10) Patent No.: US 6,522,065 B1
(45) Date of Patent: Feb. 18, 2003

(54) SINGLE PHOSPHOR FOR CREATING WHITE LIGHT WITH HIGH LUMINOSITY AND HIGH CRI IN A UV LED DEVICE

(75) Inventors: Alok Mani Srivastava, Niskayuna, NY (US); Anil Raj Duggal, Niskayuna, NY (US); Holly Ann Comanzo, Niskayuna, NY (US); William Winder Beers, Chesterland, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/534,574

(22) Filed: Mar. 27, 2000

(51) Int. Cl.$^7$ .............................................. C09K 11/82
(52) U.S. Cl. .................. 313/503; 252/301.4 R
(58) Field of Search .................. 252/301.4 R; 313/467, 313/468, 486, 503

(56) References Cited

U.S. PATENT DOCUMENTS

| | | | |
|---|---|---|---|
| 2,921,218 A | * 1/1960 | Larach et al. ............... 313/503 |
| 3,544,479 A | * 12/1970 | Datta ...................... 252/301.6 |
| 3,607,771 A | * 9/1971 | Presner et al. ............ 252/301.4 |
| 4,661,419 A | 4/1987 | Nakamura ................... 428/691 |
| 4,755,715 A | * 7/1988 | Berkstresser et al. ....... 313/468 |
| 5,198,679 A | 3/1993 | Katoh et al. .............. 250/484.1 |
| 5,571,451 A | 11/1996 | Srivastava et al. ..... 252/301.4 R |
| 5,813,753 A | * 9/1998 | Vriens et al. ............... 362/293 |
| 5,847,507 A | 12/1998 | Butterworth et al. ......... 313/512 |
| 5,851,063 A | 12/1998 | Doughty et al. ............. 362/231 |
| 5,925,897 A | 7/1999 | Oberman ..................... 257/80 |
| 5,955,835 A | * 9/1999 | Oh et al. ..................... 313/503 |
| 5,966,393 A | 10/1999 | Hide et al. ..................... 372/23 |
| 5,998,925 A | 12/1999 | Shimizu et al. ............. 313/503 |
| 6,066,861 A | 5/2000 | Höhn et al. ................... 257/99 |
| 6,069,440 A | 5/2000 | Shimizu et al. ............. 313/486 |

FOREIGN PATENT DOCUMENTS

JP    58087184    * 5/1983

OTHER PUBLICATIONS

Butler; "Fluorescent Lamp Phosphors"; Pennsylvania State University Press; 1980; pp. 98–107.
Nakamura et al.; The Blue Laser Diode; (Springer 1997); pp. 216–221, 328–329.
Blasse et al.; "Luminescent Materials"; (Springer–Verlag 1994); pp. 109–110.

* cited by examiner

Primary Examiner—Nimeshkumar D. Patel
Assistant Examiner—Thelma Sheree Clove
(74) Attorney, Agent, or Firm—Foley & Lardner (57) ABSTRACT

There is provided a white light illumination system. The illumination system includes a radiation source which emits either ultra-violet (UV) or x-ray radiation. The illumination system also includes a luminescent material which absorbs the UV or x-ray radiation and emits the white light. The luminescent material has composition $A_{2-2x}Na_{1+x}E_xD_2V_3O_{12}$. A may be calcium, barium, strontium, or combinations of these three elements. E may be europium, dysprosium, samarium, thulium, or erbium, or combinations thereof. D may be magnesium or zinc, or combinations thereof. The value of x ranges from 0.01 to 0.3, inclusive.

24 Claims, 7 Drawing Sheets

SINGLE PHOSPHOR FOR CREATING WHITE LIGHT WITH HIGH LUMINOSITY AND HIGH CRI IN A UV LED DEVICE

BACKGROUND OF THE INVENTION

This invention relates generally to an illumination system which provides white light illumination. More particularly, it relates to an illumination system which provides illumination using an ultra-violet (UV) or x-ray radiation emitting device and a luminescent material which converts the UV radiation or x-rays to white light.

A luminescent material absorbs energy in one region of the electromagnetic spectrum and emits radiation energy in another region of the spectrum. Typically, the energy of the photons emitted is lower than the energy of the photons absorbed. A luminescent material in powder form is commonly called a phosphor, while a luminescent material in the form of a transparent solid body is commonly called a scintillator.

Most useful phosphors and scintillators emit radiation in the visible portion of the spectrum in response to the absorption of radiation which is outside the visible portion of the spectrum. Thus, the phosphor converts electromagnetic radiation to which the human eye is not sensitive into electromagnetic radiation to which the human eye is sensitive. Most phosphors are responsive to more energetic portions of the electromagnetic spectrum than the visible portion of the spectrum. Thus, there are phosphors and scintillators which are responsive to ultraviolet light (as in fluorescent lamps), electrons (as in cathode ray tubes) and x-rays (as in radiography).

Two broad classes of luminescent materials are recognized. These are self-activated luminescent materials and impurity-activated luminescent materials.

A self-activated luminescent material is one in which the pure crystalline host material, upon absorption of a high energy photon, elevates electrons to an excited state from which they return to a lower energy state by emitting a photon. Self-activated luminescent materials normally have a broad spectrum emission pattern because of the relatively wide range of energies which the electron may have in either the excited or the lower energy states. Thus, excited electrons emit photons with a fairly wide range of energies during the transition from excited to lower energy state, the energy of the emitted photon depending on the particular energies the electron has before and after its emissive transition.

An impurity activated luminescent material is normally one in which a non-luminescent host material has been modified by including an activator species which is present in the host material in a relatively low concentration, such as in the range from about 200 parts per million to 1,000 parts per million. However, some materials require several mole or atomic percent of activator ions for optimized light output. With an impurity activated luminescent material, the activator ions may directly absorb the incident photons or the lattice may absorb the incident photons and transfer the absorbed photon energy to the activator ions.

Alternatively, if the photon is absorbed directly by the activator ion, the photon raises an electron of the activator ion to an excited state. These electrons, in returning to their lower energy state, emit a photon of luminescent light.

When a host lattice absorbs the incident photon (i.e. the excitation energy) and transfers it to the activator ion, the host lattice acts as a sensitizer. The host lattice may also be doped with sensitizer atoms. The sensitizer atoms absorb the incident photon either directly, or from the host lattice, and transfer it to the activator ion.

Typically, it is desirable that the light from a lamp provide white light, so that light from the sun, a natural light source, is imitated. The sun is a black body radiator, and thus its radiation emission spectrum obeys Planck's equation:

$$E(\lambda) = A\lambda^{-5}/(\exp(B/T_c)-1).$$

$E(\lambda)$ is the amount of light emitted at wavelength $\lambda$, $T_c$ is the color temperature of the black body, and A and B are constants. As the temperature, $T_c$, of the black body increases, the wavelength of the highest intensity emission will decrease. Thus, as the temperature of a black body with a peak intensity emission in the red is increased, the peak intensity emission will shift toward the blue. Although the highest intensity emission shifts in wavelength (and therefore color) with a change in temperature, the color of the broad spectrum of light emitted from a black body is considered to be white.

In contrast to the broad spectral range of light emitted from a black body radiator, the range of wavelengths of light emitted from a white light luminescent lamp may consist of only a couple of narrow emission bands, each band with a narrow range of wavelengths. These narrow emission bands may be seen as white light because, in general, the color of any light source may be matched by using a mixture of three primary colors. White light, for example, may be generated by mixing blue and orange light, or blue, green, and red light, or other combinations.

Figure 1:
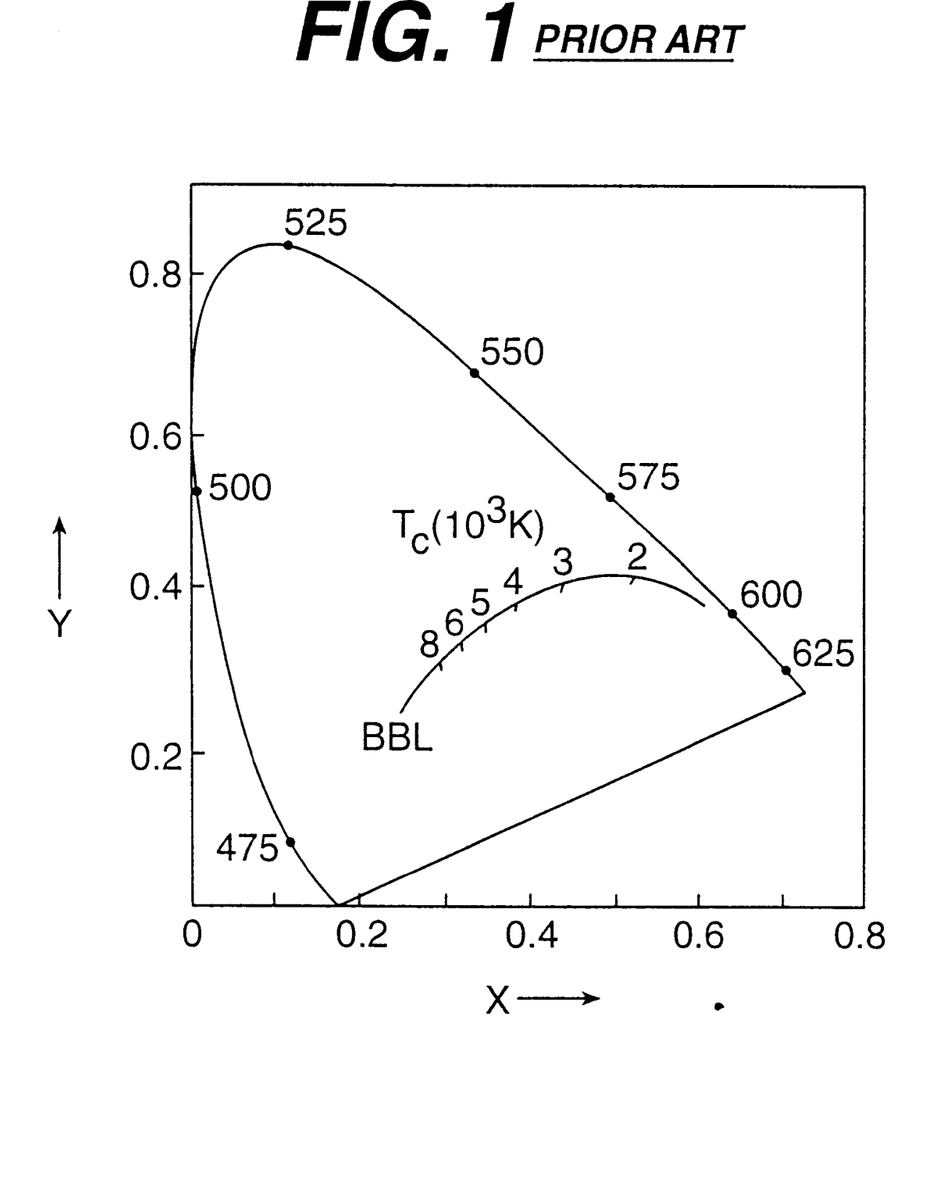
FIG. 1 is a chromaticity diagram showing a black body locus (BBL)

Because any real color may be matched by a combination of other colors, it is possible to represent any real color with color point coordinates x and y in a C.I.E. chromaticity diagram as shown in FIG. 1. The C.I.E. specification of colors and chromaticity diagrams are discussed, for example, in a textbook by K. H. Butler, "Fluorescent Lamp Phosphors, Technology and Theory" (Penn. State U. Press 1980), pages 98–107, which is incorporated by reference. The color point coordinates of any real color are represented by a point located within the region bounded by the curved line representing spectral colors from extreme red to extreme violet, and the line directly between extreme red and extreme violet. In FIG. 1, the spectral curved line is marked at certain points by the wavelength (in nm) corresponding to that color point.

The color points corresponding to a black body at various temperatures are given by the black body locus (BBL). Because the color emitted from a black body is considered to be white, and white light is generally desirable for a lamp, it is generally desirable that color point of the light emitted from the luminescent material of a luminescent lamp fall on or near the BBL. A portion of the BBL is shown in FIG. 1 with several color temperature points highlighted on the BBL.

Another measure of the whiteness of the light emitted from a light source is given by the color rendering index (CRI) of the light source. A CRI of 100 is an indication that the light emitted from the light source is similar to that from a black body source, i.e., white.

Currently, commercial systems are available which can provide visible white light illumination using a light emitting diode (LED) combined with a phosphor. For example, one commercial system includes a blue light emitting diode of InGaN semiconductor combined with a $Y_3Al_5O_{12}$-$Ce^{3+}$ (YAG-$Ce^{3+}$) phosphor. The YAG-$Ce^{3+}$ phosphor is coated on the InGaN LED, and a portion of the blue light emitted from the LED is converted to yellow light by the phosphor. Another portion of the blue light from the LED is transmitted through the phosphor. Thus, this system emits both blue light emitted from the LED, and yellow light emitted from the phosphor. The mixture of blue and yellow emission bands are perceived as white light by an observer with a CRI in the middle 80s and a color temperature, $T_c$, that ranges from about 6000 K to about 8000 K. The preferred color temperature of the white light illumination system will depend upon the particular application and preference of the user.

However, the cerium doped YAG phosphor suffers from several disadvantages. First, the cerium doped YAG phosphor system excited with a blue LED requires precise control of the cerium concentration in order to emit white light, i.e., light with a color point on or near the BBL. Second the color of the light output of the blue LED/YAG phosphor system is sensitive to the phosphor thickness. Third, the cerium doped YAG has a low efficiency and a yellow color output with excitation from a radiation source with wavelengths in the UV.

To maintain white light emitted from the blue LED and cerium doped YAG phosphor system, the cerium concentration must be controlled. A deviation in cerium concentration from the desired concentration may result in an undesired deviation from white in the color of the light generated by the system. While the cerium concentration may affect the color of the light generated by the system, the thickness of the phosphor material, as discussed below, is a more important consideration and requires careful control for generating good quality white light.

The white light is generated by a mixture of the yellow light emitted by the phosphor and the blue light emitted by the LED and transmitted through the phosphor. Thus, the color output of the system will be very sensitive to the thickness of the phosphor material. As the thickness increases, more blue light is absorbed by the phosphor instead of being transmitted through. The light emitted by the system will then have a stronger yellow component emitted from the phosphor as compared to the blue component transmitted through. The resulting light will thus appear yellowish as the thickness of the phosphor material deviates above the desired thickness. Likewise, the light emitted by the system will appear bluish if the phosphor thickness deviates below the desired thickness.

Furthermore the cerium doped YAG phosphor does not work well with UV excitation. Specifically, the cerium doped YAG phosphor system has a poor UV efficiency. Furthermore, since blue radiation transmitted from the LED is required to produce white light, such white light output cannot be achieved using YAG-$Ce^{3+}$ and a UV emitting LED.

Another known white light illumination system which employs luminescent materials uses a blend of phosphors, each phosphor having different emission bands. The different emission bands together generate white light illumination. This system requires more than a single phosphor to generate the white light illumination, and is complicated to manufacture.

BRIEF SUMMARY OF THE INVENTION

In view of the foregoing, it would be desirable to provide an illumination system that avoids or reduces the above mentioned problems.

In accordance with one aspect of the present invention, there is provided an illumination system. The illumination system comprises a radiation source which emits ultra-violet (UV) or x-ray radiation. The illumination system also comprises a luminescent material which absorbs the UV or x-ray radiation from the radiation source and emits visible light. The luminescent material has a composition $A_{2-2x}Na_{1+x}E_xD_2V_3O_{12}$. A comprises at least one of calcium, barium, and strontium. E comprises at least one of the rare earths of europium, dysprosium, samarium, thulium, and erbium. D comprises at least one of magnesium and zinc. The value of x is in the range from 0.01 to 0.3 inclusive.

In accordance with another aspect of the present invention, there is provided a method for converting ultra-violet (UV) or x-ray exciting radiation to visible light. This method comprises directing the exciting radiation from the radiation source to a luminescent material. The luminescent material comprises composition $A_{2-2x}Na_{1+x}E_xD_2V_3O_{12}$. A comprises at least one of calcium, barium, and strontium. E comprises at least one of europium, dysprosium, samarium, thulium, and erbium. D comprises at least one of magnesium and zinc. The value of x is in the range from 0.01 to 0.3 inclusive.

DETAILED DESCRIPTION OF THE INVENTION

It would be desirable to provide a system that provides white light illumination from a single luminescent material. It would also be desirable to provide an illumination system that provides white light, where the concentration of the activator ion and the thickness of the luminescent material need not be precisely controlled. It would also be desirable to provide an illumination system which responds to excitation energies in the UV and x-ray region of the electromagnetic spectrum.

The present inventors have recognized that the problems of the prior art may be reduced or overcome by utilizing a single phosphor which preferably emits white light in response to exciting radiation beyond the visible. The color of the light output of such a system would not be strongly sensitive to the variations in the thickness of the luminescent material.

Figure 2:
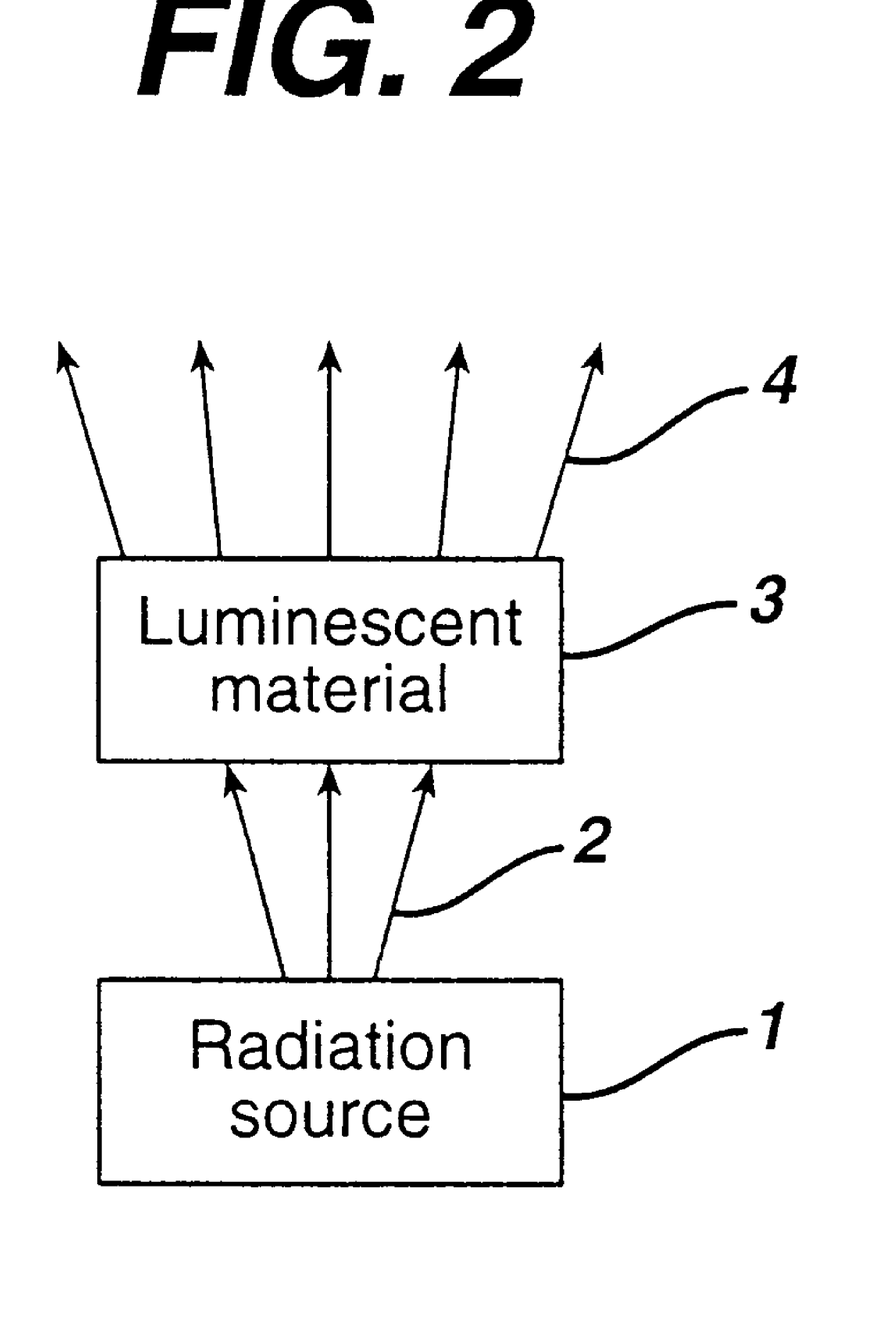
FIG. 2 shows a schematic of an illumination system according to an embodiment of the present invention.

FIG. 2 shows an illumination system according to one embodiment of the present invention. The illumination system includes a radiation source 1. The source 1 may be, for example, a light emitting diode (LED), a lamp, a laser, or some other source of radiation. The radiation source may be any source which emits radiation which excites the luminescent material 3 of the present invention, and thus causes the luminescent material 3 to emit visible light. Preferably, the radiation source emits radiation at less than 400 nm, such as UV or x-ray radiation or combinations thereof. Most preferably, the radiation is UV radiation.

The radiation source 1 emits radiation 2 towards a luminescent material 3. The luminescent material 3 absorbs the exciting UV radiation, and emits luminescent light 4 in the visible range of the spectrum. Preferably, the luminescent light 4 is white in color.

The luminescent material 3 according to the preferred embodiment of the present invention has the composition $A_{2-2x}Na_{1+x}E_xD_2V_3O_{12}$. A may comprise calcium, barium, strontium, or combinations of these three elements. E may comprise a rare earth, such as europium, dysprosium, samarium, thulium, or erbium, or combinations thereof. Preferably, the main rare earth activator is Eu. Of course, even if Eu is the main rare earth activator, smaller amounts of other mentioned rare earth ions may also be present. D may comprise magnesium or zinc, or combinations thereof. The value of x preferably ranges from 0.01 to 0.03 inclusive, i.e., $0.01 \leq x \leq 0.3$. The luminescent material 3, as synthesized, has a cubic garnet crystal structure. The rare earth free host structure, $A_2NaD_2V_3O_{12}$, is a self-activated material with a characteristic broad spectrum emission pattern. The host absorption typically occurs at wavelengths less than about 400 nm. While the present inventors do not wish to be bound by any particular theory as to the mechanism for host absorption and emission, the present inventors believe that the host lattice absorption is due to the vanadate group $[VO_4]^{3-}$. In the case of a host structure of $Ca_2Na Mg_2V_3O_{12}$, and excitation radiation of 370 nm, the host structure emission spectrum is a broad band centered at around 530 nm.

The rare earth atoms of Eu, Dy, Sm, Tm, and/or Er act as impurity activators when introduced in the host structure. The Eu, Dy, Sm, Tm, and/or Er doped luminescent material 3 is simultaneously a self-activated material, with the host structure providing luminescence, and an impurity activated luminescent material, with luminescence from the impurity activators within the host structure. The emission spectrum from the luminescent material 3 includes both the broad emission from the host structure and the much narrower emission from the rare earth impurity activators, typically centered at a longer wavelength than the broad emission.

The present inventors believe that the host structure acts as sensitizer, absorbing the excitation energy from the UV source and transferring this energy to the rare earth ions of either Eu, Dy, Sm, Tm, or Er, which emit the energy in the form of light radiation. In the case of Eu in a $Ca_2Na Mg_2V_3O_{12}$ host structure, light is emitted in a bright red line emission at 610 nm.

Figure 3:
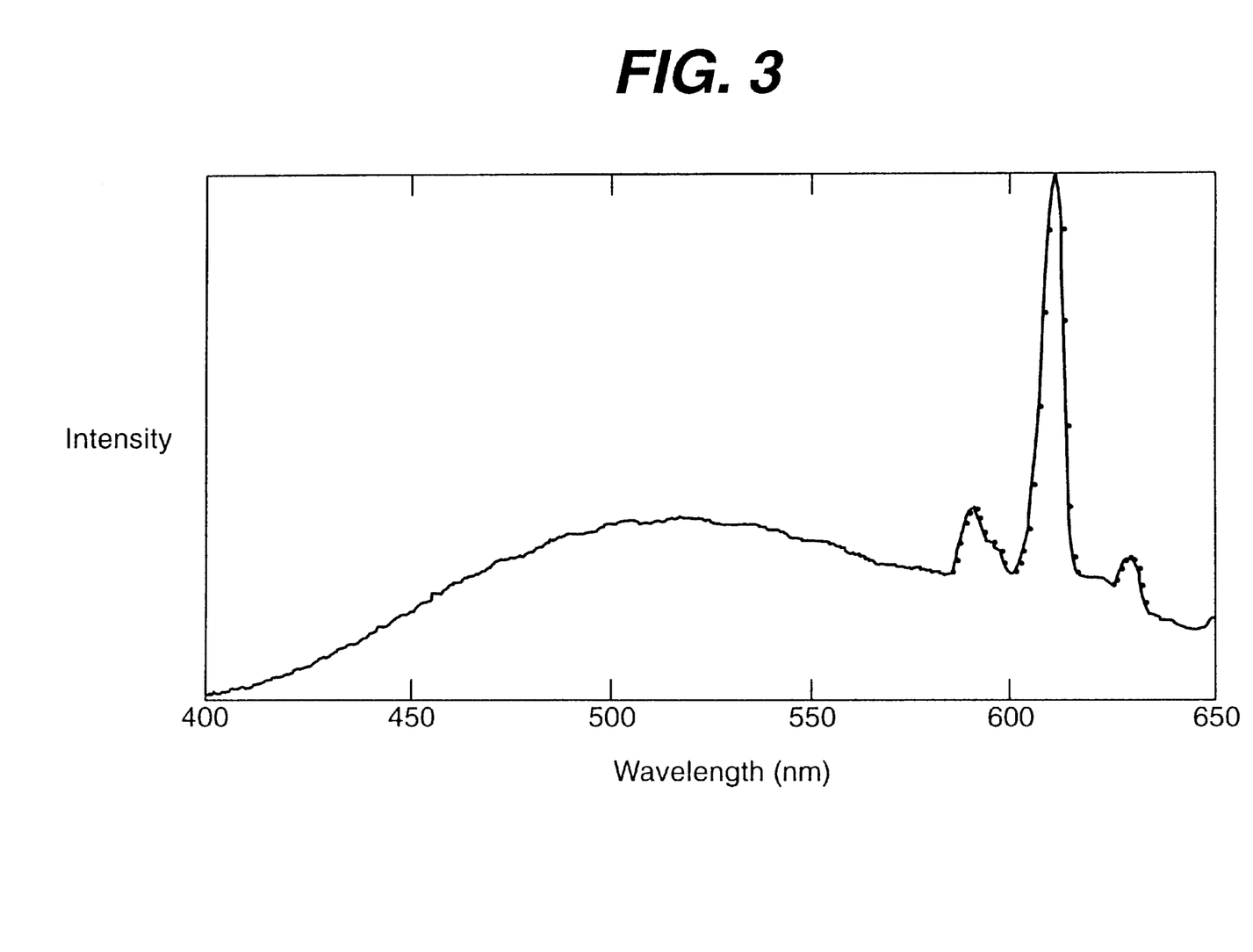
FIG. 3 shows an excitation spectra of a luminescent material according to an embodiment of the present invention.

The emission spectrum for $Ca_{2-2x}Na_{1+x}Eu_xMg_2V_3O_{12}$ for 370 nm UV excitation, with x equal to 0.03 is shown in FIG. 3. The broad emission peak centered at around 530 mn is believed to result from the host structure emission. The much narrower red emission at 610 nm and two smaller satellite lines are believed to be due to Eu activator emission. The overall emission spectrum spans the visible range and produces a white light emission. This well balanced emission spectrum produces a white field with a color rendering index (CRI) of 87 and a luminosity of 354 lumens per optical watt. The color coordinates (x=0.36, y=0.40) on the C.I.E. chromaticity diagram of this emission light are near the BBL correspond to a color temperature of 4670 K.

Dy may be substituted in whole or in part for Eu in the host structure. Dy emits in the yellow instead of in the red. However, like Eu, the concentration of Dy may be adjusted so that the luminescent material 3 produces a white color when excited with the UV source 1. Sm, Tm, or Er may also be included as rare earth activators.

When the concentration of Eu in the luminescent material 3 is varied from x=0.03, the color coordinates of the light emitted from the luminescent material change. However, advantageously, the color coordinates can be made to roughly follow the BBL. In other words, although the color coordinates change when the concentration of Eu is changed, the light emitted remains generally white, albeit at a different color temperature, Tc. For example, as the concentration of Eu is increased from 0.03, the color coordinate, x, increases, the coordinate y decreases slightly, and the emitted light remains generally white, although the color temperature, Tc, decreases. Thus, a range of whitish colors can be attained from a single material.

Figure 4:
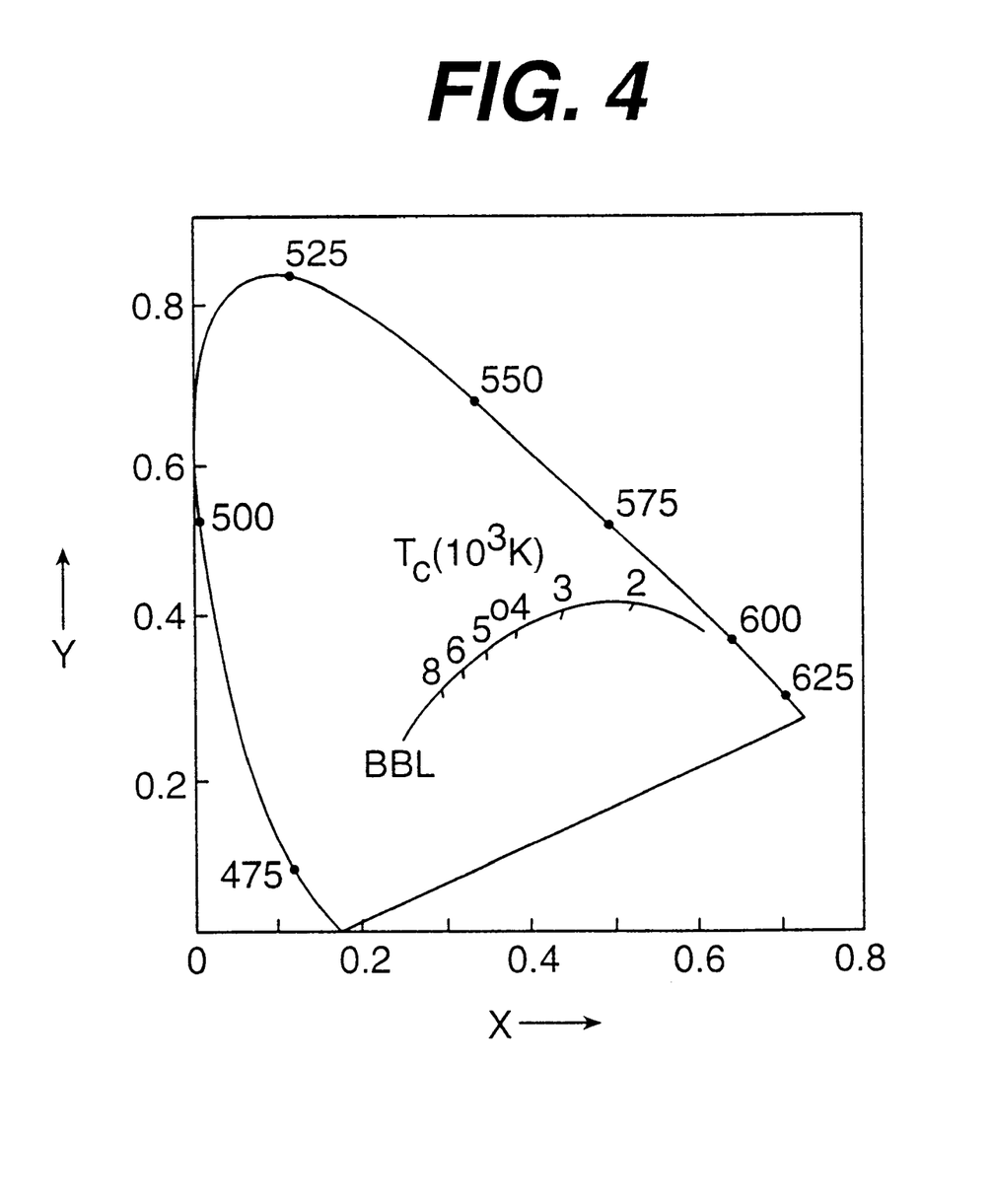
FIG. 4 is a chromaticity diagram showing the color coordinate points of a luminescent material according to an embodiment of the present invention.

Furthermore, because the luminescent material of the present invention contains more than one component which affects the emission spectra of the material, the composition of the luminescent material may be readily adjusted so that when the concentration of Eu is changed, the color of the light emitted from luminescent material will closely follow the BBL, i.e., remain white. This effect is illustrated in FIG. 4. The open circle at the color coordinate (x=0.36, y=0.40) corresponds to a europium concentration of 0.03. The arrow from that open circle indicates the direction of the change of the color coordinates for increasing Eu concentration. As can be seen, the arrow points generally in the direction of increasing x. In this case, Dy may be added to cause the color of the emitted light to move closer to the BBL, and thus to be whiter.

The emission peak due to the host structure may also be changed to compensate for a change in Eu concentration so that the color of the overall emission remains white. The emission peak due to the host structure can be changed by the changing the composition of the host structure, i.e., by replacing all or part of the Ca with Ba or Sr, or by replacing all or part of the Mg with Zn.

Because the luminescent material of the present invention may produce white light simply by emitting luminescent radiation, the light emitted by the present invention is not strongly dependent upon the thickness of the luminescent material. Thus, the present invention has advantages over prior art systems which required light from the exciting radiation source in addition to the luminescent light to produce white light.

The luminescent material may comprise a phosphor or a scintillator. The phosphor form of the luminescent material may be made, for example, by any ceramic powder method, such as a liquid phase (flux) method or a solid state method. Preferably, the method of making the phosphor comprises the following steps. First, the starting compounds of the phosphor material are mixed in a crucible or another suitable container, such as a ball mill to form a first powder. For example, the starting materials may be blended using a ball mill with $ZrO_2$ or yttrium toughened zirconia milling media. The preferred starting phosphor compounds comprise oxides, carbonates, hydroxides, nitrates or oxalates of the metal constituents. For example, to form $Ca_{2-2x}Na_{1+x} Eu_xMg_2V_3O_{12}$, stoichiometric amounts of calcium carbonate ($CaCO_3$), sodium carbonate ($NaHCO_3$), ammonium vanadate ($NH_4VO_3$ or $V_2O_5$) europium oxide $Eu_2O_3$, and magnesium carbonate ($MgCO_3$, $4MgCO_3 \cdot Mg(OH)_2 \cdot 4H_2O$) or magnesium oxide (MgO) may be mixed in the crucible or ball mill.

The blended first powder is then fired in a furnace for between about 5 and 25 hours at 600 to 1000° C. A flux may be added to the first powder to promote the sintering process. The sintered body is then milled to form a second powder. Preferably, the second powder is milled until it has a desired median particle size with a narrow particle distribution. The second powder is preferably milled in propanol or water as the milling media or liquid and subsequently dried. However, other milling media, such as methanol, for example, may be used instead.

The second powder is then coated onto the desired substrate, such as an LED, display screen or a lamp bulb. Preferably, a suspension of the second powder and a liquid is used to coat the substrate. The suspension may contain a binder in a solvent. Preferably, the binder comprises an organic material, such as nitrocellulose, in a solvent such as butyl acetate, amyl acetate, methyl propanol or propylene glycol mono-methyl ether acetate at a 90–95% level with 1–2% denatured ethanol. The binder enhances the adhesion of the powder particles to each other and to the some substrates. However, the binder may be omitted to simplify processing, if desired. After coating, the suspension is dried and may be heated to evaporate the binder further.

The scintillator form of the luminescent material may be made by any scintillator fabrication method. For example, the scintillator may be formed by Czochralski, float zone, and crystal growing methods may be used.

Figure 5A:
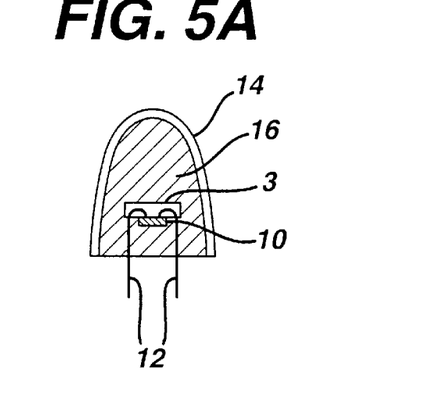
FIGS. 5a–5c are side cross sectional views of an LED illumination system in accordance with exemplary embodiments of the present invention.

FIGS. 5a–5c, 6, and 7 show specific embodiments of the illumination system according to the present invention. FIG. 5a is an illumination system according to one aspect of the invention using a light emitting diode (LED) as a UV source. The illumination system includes an LED chip 10, and leads 12 electrically attached to the LED chip. The leads 12 provide current to the LED chip 10 and thus allow the LED chip 10 to emit radiation. The radiation emitted by the LED chip 10 is in the UV region of the electromagnetic spectrum, and the wavelength of this radiation is preferably less than about 400 nm. For example, the LED chip 10 may emit at about 370 nm.

The LED chip 10 is encapsulated within a shell 14 which encloses the LED chip and encapsulant material 16. The encapsulant material may be, for example, an epoxy or a polymer material such as silicone. The illumination system of this embodiment of the present invention also includes a luminescent material 3, adjacent the LED chip 10. If the luminescent material 3 is a phosphor, the luminescent material 3 may be formed over the LED chip 10, for example, by coating the light emitting surface of the chip with the phosphor. If the luminescent material 3 is a solid scintillator, the luminescent material may be affixed to or over the light emitting surface of the LED chip 10. Both the shell 14 and the encapsulant 16 should be transparent to allow visible light to be transmitted through those elements. The shell 14 may be, for example, glass or plastic.

The luminescent material 3 covers the LED chip 10, and thus UV light emitted by the LED chip is incident upon the luminescent material 3. The luminescent material 3 preferably has the composition $A_{2-2x}Na_{1+x}E_xD_2V_3O_{12}$. A may comprise calcium, barium, strontium, or combinations of these three elements. E may comprise one of the rare earths europium, dysprosium, samarium, thulium, and erbium, and combinations thereof. D may comprise magnesium or zinc. The value of x may be in the range from 0.01 to 0.3 inclusive, i.e., $0.01 \leq x \leq 0.3$. Preferably the composition of the luminescent material 3 is set so that the light emitted by the luminescent material is white light, as discussed above.

Figure 5B:
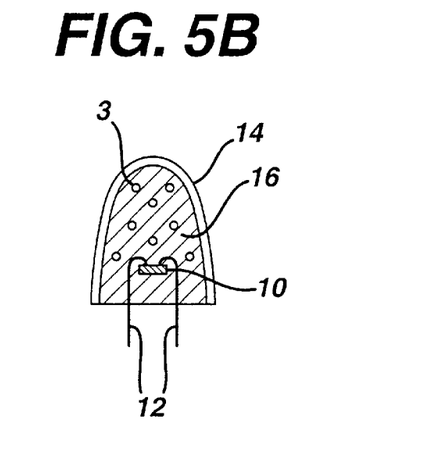

FIG. 5b shows an alternative embodiment to that of FIG. 5a. The elements in the embodiment of FIG. 5b are the same as that of FIG. 5a, except that in the embodiment of FIG. 5b the luminescent material 3 is interspersed within the encapsulant material 16, instead of being formed over the LED chip 10. The luminescent material 3 in FIG. 5b, preferably has the same composition formula as that for the material in FIG. 5a, i.e., $A_{2-2x}Na_{1+x}E_xD_2V_3O_{12}$. In this embodiment of FIG. 5b, the luminescent material 3 may interspersed within the encapsulant material 16, for example, by mixing the luminescent material 3 in powder form (a phosphor) with the encapsulant material 16. For example, the luminescent material 3 may be added as a powder to a polymer precursor, and then the polymer precursor may be cured to solidify it.

Figure 5C:
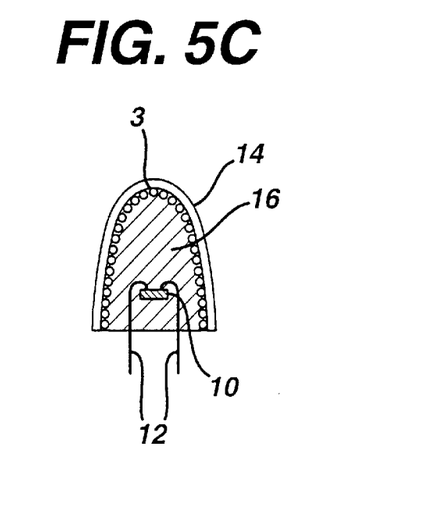

FIG. 5c shows another alternative embodiment to that of FIG. 5a. The embodiment of FIG. 5c is the same as that of FIG. 5a, except that in the embodiment of FIG. 5c the luminescent material 3 is coated on the shell 14, instead of being formed over the LED chip 10. The luminescent material 3 is preferably coated on the inside surface of the shell 14, although the luminescent material may be coated on the outside surface of the shell 14. As another alternative, the shell 14 may be made of the luminescent material 3 in scintillator form. The luminescent material 3 in FIG. 5c preferably has the same composition formula as that for the material in FIG. 5a, i.e, $A_{2-2x}Na_{1+x}E_xD_2V_3O_{12}$. Of course, the embodiments of FIGS. 5a–5c may be combined and the luminescent material may be located in any two or all three locations.

Figure 6:
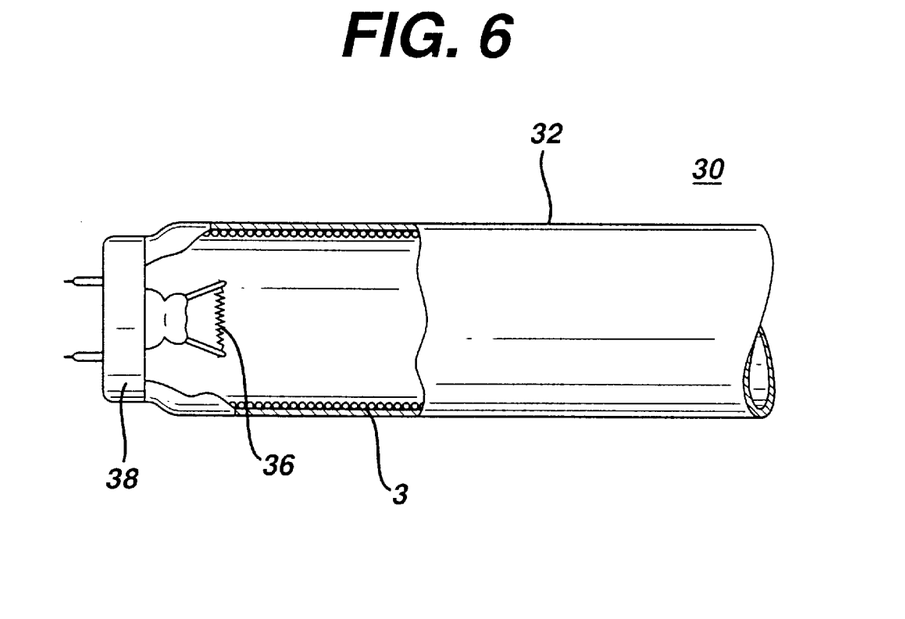
FIG. 6 is a side cross sectional views of a fluorescent lamp illumination system in accordance with an exemplary embodiment of the present invention.

FIG. 6 is an illumination system according to another embodiment of the invention where the system comprises a fluorescent lamp 30. The flourescent lamp 30 includes a bulb or cover 32 filled with a gas. The luminescent material 3 is formed as a phosphor on the interior surface of the bulb 32. The fluorescent lamp 30 also includes plural cathodes or gas discharge electrodes 36 and a lamp base 38. Alternatively, the luminescent material 3 may be coated on the outside surface of the bulb 32, or on a separate envelope containing the gas. The bulb 32 is preferably made of glass. Other appropriate transparent materials, such as plastics, may also be used. The gas, such a mercury, emits ultraviolet radiation when a potential is applied to the cathode 36 through the base 38. The luminescent material 3 absorbs the incident UV radiation from the gas and preferably emits white light. The luminescent material 3 in FIG. 6 preferably has the same composition formula as that for the material in FIG. 5a, i.e, $A_{2-2x}Na_{1+x}E_xD_2V_3O_{12}$.

Figure 7:
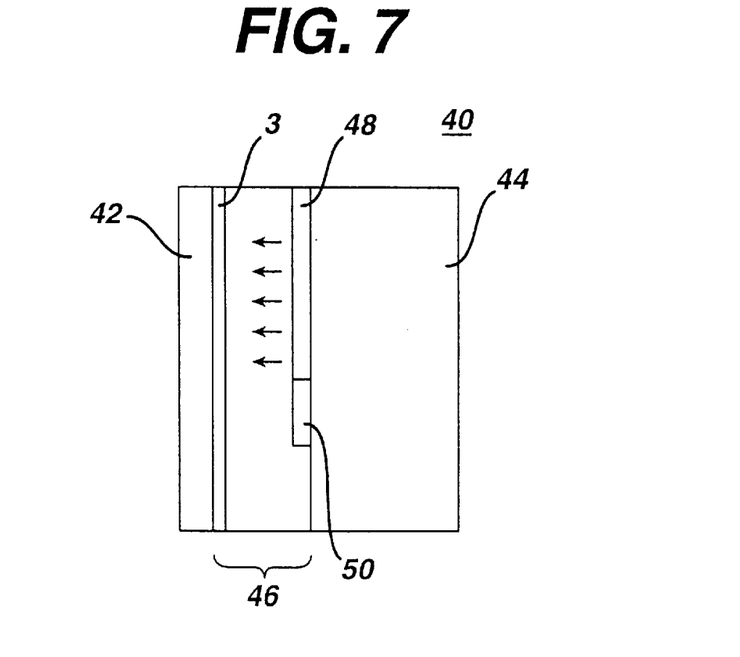
FIG. 7 is a side cross sectional view of a plasma display illumination system in accordance with an exemplary embodiment of the present invention.

FIG. 7 is an illumination system according to another embodiment of the invention where the system is a plasma display device 40. The plasma display device comprises a transparent display screen 42, an opaque housing 44, a gas envelope 46, an array of gas discharge electrodes 48 (only one electrode is shown for clarity) and a control device 50, such as a transistor. The luminescent material 3 may be formed on the interior or exterior surface of the gas envelope 46 or on the interior surface of the screen 42. When the control device 50 applies a potential to electrode 48, the electrode 48 creates a localized plasma discharge in the gas contained in the envelope 46. The localized plasma emits UV radiation that is absorbed by an adjacent portion of the luminescent material 3. The irradiated portion of the luminescent material then emits white light through the screen 42. An image may be formed on the screen 42 by controlling the application of the potential to different electrodes 48 of the electrode array.

Figure 8:
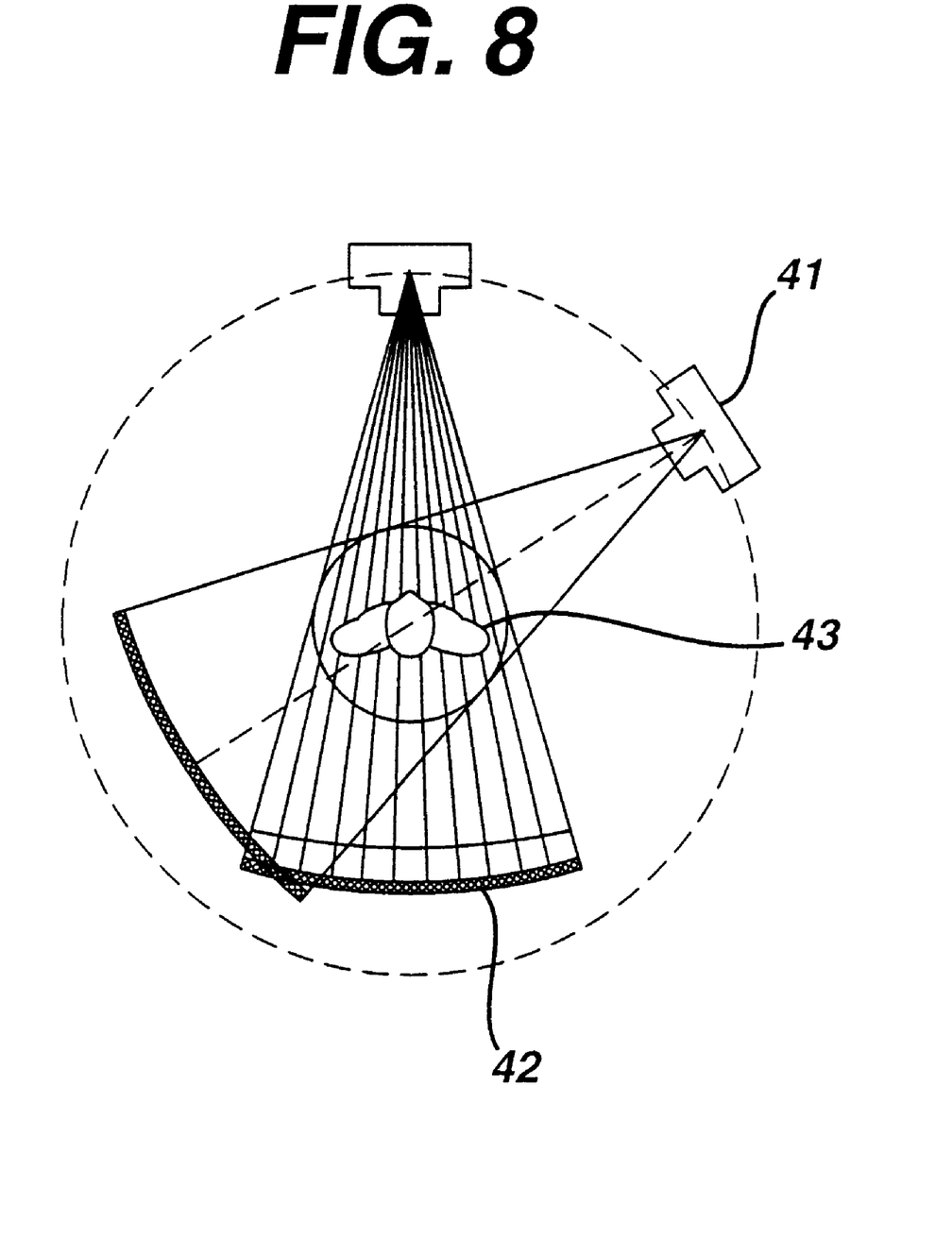
FIG. 8 is a side cross sectional view of an x-ray detection system in accordance with an exemplary embodiment of the present invention.

The luminescent material 3 of the present invention may be used in an x-ray detection system such as a computed tomography (CT) scanning system, as shown for example in FIG. 8. The CT scanning system is used to obtain cross sectional images of the human body. In a CT scanning system, an X-ray source, such as an X-ray tube 41 rotates in a circle about the patient 43. An X-ray detector 42 is placed on the opposite side of the patient 43. The detector 42 rotates synchronously with the X-ray source about the perimeter of the circle. The detector comprises the luminescent material 3 in scintillator form optically coupled to a photodiode or another type of photodetector. Alternatively, the detector 42 may comprise the luminescent material in phosphor form coated on a transparent substrate and optically coupled to a photodiode or another type of photodetector. The luminescent material 3 in FIG. 8 preferably has the same composition formula as that for the material in FIG. 5a, i.e, $A_{2-2x}Na_{1+x}E_xD_2V_3O_{12}$.

SPECIFIC EXAMPLE

A $Ca_{1.94}Na_{1.03}Eu_{0.03}Mg_2V_3O_{12}$ phosphor was made by the following method. Stoichiometric amounts of oxide and carbonate starting materials ($CaCO_3$, $NaHCO_3$, $NH_4VO_3$, $Eu_2O_3$, and MgO) were ball milled for one hour. The resulting mixture was then fired at 800° C. in air for 10 hours to form $Ca_{1.94}Na_{1.03}Eu_{0.03}Mg_2V_3O_{12}$. The phosphor appeared white. The luminescence spectrum of the resulting phosphor is shown in FIG. 3 for 370 nm excitation. The chromaticity coordinates of the phosphor were (x=0.36, y=0.40) which corresponds to white light near the BBL with a CRI of 87 and a $T_c$=4670K. The phosphor had a luminosity of 354 lumens per watt.

The preferred embodiments have been set forth herein for the purpose of illustration. However, this description should not be deemed to be a limitation on the scope of the invention. Accordingly, various modifications, adaptations, and alternatives may occur to one skilled in the art without departing from the spirit and scope of the claimed inventive concept.

All of the texts which are mentioned above are incorporated herein by reference.

What is claimed is:

1. An illumination system comprising:
   a radiation source which emits ultra-violet (UV) or x-ray radiation; and
   a luminescent material absorbing the UV or x-ray radiation from the radiation source and emitting visible light, where the luminecent material comprises a composition of matter comprising $A_{2-2x}Na_{1+x}E_xD_2V_3O_{12}$
   wherein A comprises at least one of calcium, barium, and strontium;
   E comprises at least one of europium, dysprosium, samarium, thulium, and erbium;
   D comprises at least one of magnesium and zinc; and $0.01 \leq x \leq 0.3$.

2. The illumination system of claim 1, wherein the radiation source further comprises a UV emitting light emitting diode (LED) and further comprising:
   an encapsulant encapsulating the LED; and
   a shell enclosing the encapsulant and the LED.

3. The illumination system of claim 2, wherein the luminescent material is a powder interspersed within the encapsulant.

4. The illumination system of claim 2, wherein the luminescent material is adjacent the LED.

5. The illumination system of claim 2, wherein the luminescent material is coated on the shell.

6. The illumination system of claim 2,
   wherein the radiation source further comprises a UV emitting light emitting diode (LED) and the luminescent material is adjacent the LED.

7. The illumination system of claim 1, wherein the illumination system comprises a fluorescent lamp comprising:
   a transparent bulb enclosing electrodes and a gas radiation source which emits UV radiation when a potential is applied to the electrodes.

8. The illumination system of claim 7, wherein the luminescent material is coated on an inside surface of the transparent bulb.

9. The illumination system of claim 7, wherein the luminescent material is coated on the outside surface of the transparent bulb.

10. The illumination system of claim 1, wherein the illumination system comprises a plasma display system comprising:
    a plurality of electrodes;
    a control device which applies a potential to the electrodes; and
    a display screen adjacent the luminescent material, wherein the luminescent material emits the visible light through the display screen; and
    wherein the radiation source comprises a gas which emits UV radiation when a potential is applied to the electrodes.

11. The illumination system of claim 1, wherein A comprises calcium, E comprises europium, and D comprises magnesium.

12. The illumination system of claim 2, wherein A comprises calcium, E comprises europium, and D comprises magnesium.

13. The illumination system of claim 7, wherein A comprises calcium, E comprises europium, and D comprises magnesium.

14. The illumination system of claim 10, wherein A comprises calcium, E comprises europium, and D comprises magnesium.

15. The illumination system of claim 1, wherein the visible light is white light.

16. The illumination system of claim 1, wherein the radiation source comprises a UV emitting light emitting diode (LED) and the visible light is white light.

17. The illumination system of claim 1, wherein the radiation source comprises an x-ray source, the luminescent material is a scintillator and wherein the illumination system comprises an x-ray detection system comprising:
    a photodetector detecting the visible light.

18. A method for converting ultra-violet (UV) or x-ray exciting radiation to visible light comprising:
    directing the exciting radiation from a radiation source to a luminescent material, wherein the luminescent material thereby emits visible light; and
    wherein the luminescent material comprises a composition comprising $A_{2-2x}Na_{1+x}E_xD_2V_3O_{12}$
    wherein A comprises at least one of calcium, barium, strontium;
    E comprises at least one of europium, dysprosium, samarium, thulium, and erbium;
    D comprises at least one of magnesium and zinc; and $0.01 \leq x \leq 0.3$.

19. The method of claim 18, wherein A comprises calcium, E comprises europium, and D comprises magnesium.

20. The method of claim 18, wherein the visible light is white light.

21. The method of claim 18, wherein the radiation source comprises an LED and the luminescent material comprises a phosphor over the LED.

22. A method for converting UV or x-ray radiation to white light comprising:

directing the UV or x-ray exciting radiation from a radiation source to a single luminescent material; and emitting white light from the single luminescent material;

wherein the single luminescent material comprises a phosphor composition comprising $A_{2-2x}Na_{1+x}E_xD_2V_3O_{12}$ wherein A comprises at least one of calcium, barium, strontium;

E comprises at least one of europium, dysprosium, samarium, thulium, and erbium;

D comprises at least one of magnesium and zinc; and $0.01 \leq x \leq 0.3$; and wherein the radiation source is an InGaN light emitting diode (LED).

23. The method of claim 22, wherein the color of the emitted light is independent of the thickness of the luminescent material.

24. The method of claim 23, wherein A comprises calcium, E comprises europium and D comprises magnesium.

* * * * *

UNITED STATES PATENT AND TRADEMARK OFFICE
CERTIFICATE OF CORRECTION

PATENT NO.     : 6,522,065 B1
DATED          : February 18, 2003
INVENTOR(S)    : Alok Mani Srivastava et al.

It is certified that error appears in the above-identified patent and that said Letters Patent is hereby corrected as shown below:

Column 1,
Line 4, please insert the following heading and paragraph before the heading "BACKGROUND OF THE INVENTION":
-- STATEMENT REGARDING FEDERALLY SPONSORED RESEARCH OR DEVELOPMENT
   The U.S. Government may have certain rights in this invention pursuant to grant number 70NANB8H4022 from the NIST. --

Signed and Sealed this

Second Day of March, 2004

JON W. DUDAS
*Acting Director of the United States Patent and Trademark Office*